US012812891B2

(12) United States Patent
Su et al.

(10) Patent No.: US 12,812,891 B2
(45) Date of Patent: Nov. 24, 2026

(54) SEMICONDUCTOR STRUCTURE FOR TRANSISTOR AND FABRICATION METHOD THEREOF

(71) Applicant: Semiconductor Manufacturing International (Shanghai) Corporation, Shanghai (CN)

(72) Inventors: Bo Su, Shanghai (CN); Yijun Zhang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 363 days.

(21) Appl. No.: 18/523,222

(22) Filed: Nov. 29, 2023

(65) Prior Publication Data

US 2024/0222486 A1 Jul. 4, 2024

(30) Foreign Application Priority Data

Jan. 3, 2023 (CN) ........................ 202310002271.X

(51) Int. Cl.

*H10D 30/43* (2025.01)
*H10D 30/01* (2025.01)
*H10D 30/67* (2025.01)
*H10D 62/10* (2025.01)
*H10D 64/23* (2025.01)

(52) U.S. Cl.

CPC ........... *H10D 30/43* (2025.01); *H10D 30/014* (2025.01); *H10D 30/6735* (2025.01); *H10D 62/121* (2025.01); *H10D 64/258* (2025.01)

(58) Field of Classification Search

CPC .... H10D 30/43; H10D 30/014; H10D 64/258; H10D 62/121; H10D 30/6735

USPC .......................................................... 257/401

See application file for complete search history.

(56) References Cited

U.S. PATENT DOCUMENTS

| | | | | |
|---|---|---|---|---|
| 11,056,574 | B2 * | 7/2021 | Wostyn | H10D 84/017 |
| 11,955,475 | B2 * | 4/2024 | Shin | H10D 30/014 |
| 12,615,812 | B2 * | 4/2026 | Xie | H10D 62/118 |
| 2016/0141360 | A1 * | 5/2016 | Cheng | H10D 62/121 438/157 |
| 2021/0351297 | A1 * | 11/2021 | Zhu | H10D 84/0128 |
| 2022/0157957 | A1 * | 5/2022 | Jin | H10D 30/6219 |
| 2022/0328642 | A1 * | 10/2022 | Jin | H10D 30/6735 |
| 2022/0384446 | A1 * | 12/2022 | Harada | H10B 12/33 |
| 2022/0384512 | A1 * | 12/2022 | Lee | H10F 39/18 |
| 2023/0007959 | A1 * | 1/2023 | Joe | H10D 30/024 |

* cited by examiner

*Primary Examiner* — Jami Valentine Miller

(74) *Attorney, Agent, or Firm* — Anova Law Group, PLLC

(57) ABSTRACT

A semiconductor structure includes a substrate, channel layers arranged in parallel along a first direction, gate structures arranged in parallel along a second direction, source doped regions and drain doped regions located on two sides of the gate structures respectively, and a metal layer. The gate structures surround the channel layers, respectively. The first and second directions are parallel to a substrate surface and perpendicular to each other. The source and drain doped regions contact the channel layers, respectively. The metal layer contacts one of the source or drain doped regions. The metal layer, one of the source doped regions, one of the drain doped regions, and one of the gate structures are stacked along the second direction.

20 Claims, 9 Drawing Sheets

SEMICONDUCTOR STRUCTURE FOR TRANSISTOR AND FABRICATION METHOD THEREOF

CROSS-REFERENCE TO RELATED APPLICATION

This application claims the priority of Chinese Patent Application No. 202310002271.X, filed on Jan. 3, 2023, the content of which is incorporated herein by reference in its entirety.

TECHNICAL FIELD

The present disclosure generally relates to the field of semiconductor technology and, more particularly, relates to a semiconductor structure and its fabrication method.

BACKGROUND

While the performance of transistors improves as size shrinks, this is not the case for interconnect metals. In fact, as dimensions shrink, the contact resistance of interconnect metals can increase by a factor of 10. It causes resistor-capacitor (RC) delay and degraded performance. It also increases power consumption, which affects the performance of devices at advanced nodes such as SRAM. Therefore, there is a need to improve the problem of device contact resistance at advanced nodes.

The disclosed structures and methods are directed to at least partially alleviate one or more problems set forth above and to solve other problems in the art.

SUMMARY

One aspect of the present disclosure provides a semiconductor structure that includes a substrate, channel layers arranged in parallel along a first direction over the substrate, gate structures arranged in parallel along a second direction over the substrate, source doped regions and drain doped regions located on two sides of the gate structures respectively, and a metal layer over the substrate. The gate structures surround the channel layers, respectively. The first direction and second direction are parallel to a substrate surface and perpendicular to each other. The source and drain doped regions contact the channel layers, respectively. The metal layer contacts one of the source or drain doped regions. The metal layer, one of the source doped regions, one of the drain doped regions, and one of the gate structures are stacked along the second direction over the substrate.

Another aspect of the present disclosure provides a method for forming a semiconductor structure. The method includes: providing a substrate; forming stack structures arranged in parallel along a first direction over the substrate, wherein an extension direction of each stack structure is parallel to a second direction, each stack structure includes a first sacrificial layer, a channel layer on the first sacrificial layer, and a second sacrificial layer on the channel layer, and the first and second directions are parallel to a substrate surface and perpendicular to each other; forming a mask layer over the substrate, wherein the mask layer is on a sidewall surface and a top surface of the stack structures, an initial first opening is in the mask layer, an extension direction of the initial first opening is parallel to the first direction, and the initial first opening exposes a part of the sidewall surface and the top surface; removing first and second sacrificial layers exposed by the initial first opening to form a first opening, wherein the first opening exposes a surface of the channel layer; forming a gate structure in the first opening, wherein the gate structure surrounds the channel layer; forming two second openings on two sides of the gate structure and in the mask layer, wherein an extension direction of the second openings is parallel to the first direction, and the second openings expose a sidewall surface of the gate structure and a part of a surface of the channel layer; forming a source doped region and a drain doped region in the second openings, wherein the source and drain doped regions contact the channel layer; removing the mask layer after the source and drain doped regions are formed; and forming a metal layer over the substrate after the mask layer is removed, wherein the metal layer contacts the source or drain doped region, and the metal layer, the source and drain doped regions, and the gate structure are stacked along the second direction over the substrate.

Another aspect of the present disclosure provides a semiconductor structure that includes a substrate, a channel layer extending along a first direction parallel to a substrate surface, a first metal layer, a source layer as a source doped region, a gate layer as a gate structure, a drain layer as a drain doped region, and a second metal layer. The first metal layer, source layer, gate layer, drain layer, and second metal layer are perpendicular to the first direction and the substrate, and stacked along the first direction. The channel layer passes through the source layer, gate layer, and drain layer along the first direction.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
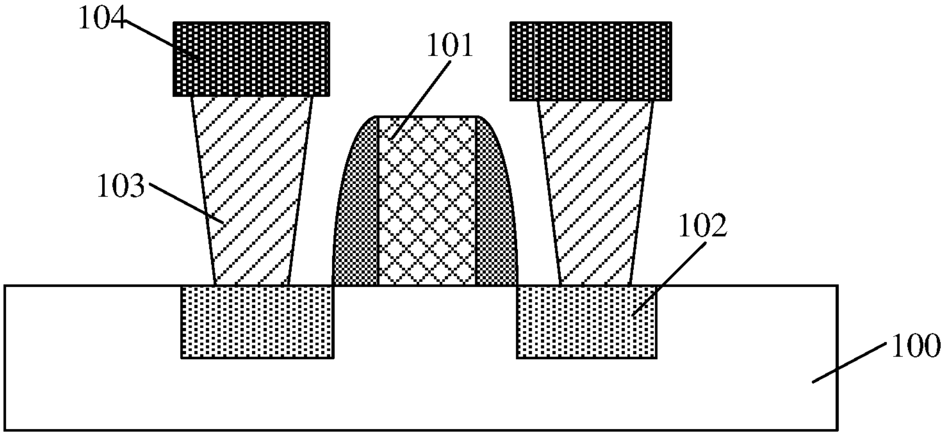
FIG. 1 illustrates a cross-sectional view of a semiconductor structure.

Reference will now be made in detail to exemplary embodiments of the disclosure, which are illustrated in the accompanying drawings. Wherever possible, the same reference numbers will be used throughout the drawings to refer to the same or like parts.

The present disclosure provides a semiconductor structure and methods for forming the semiconductor structure. It may improve problems of device contact resistance at advanced nodes.

The semiconductor structure includes a substrate, channel layers arranged in parallel along a first direction over the substrate, gate structures arranged in parallel along a second direction over the substrate, a source doped region and a drain doped region located on two sides of the gate structure, and a metal layer over the substrate. The gate structure surrounds the channel layer. The first and second directions are parallel to the substrate surface and perpendicular to each other. The source and drain doped regions contact the channel layer, respectively. The metal layer contacts the source and drain doped regions. The metal layer, source and drain doped regions, and gate structure are stacked along the second direction over the substrate.

Optionally, the semiconductor structure further includes an isolation layer located on a sidewall and top surface of the gate structure. The isolation layer is located between the source or drain doped region and the gate structure.

Optionally, the material of the isolation layer includes a dielectric material that includes one or more of silicon, carbon, nitrogen, and oxygen element.

Optionally, the material of the channel layer includes a semiconductor material, and the semiconductor material includes silicon or germanium.

Optionally, the semiconductor structure further includes an insulation layer located over the substrate. The gate structure is located over the insulation layer.

Optionally, the heights of the metal layer and the source and drain doped regions are flush over the substrate.

Optionally, the source and drain doped regions are sheet-like structures perpendicular to the substrate surface.

The present disclosure also provides a method for fabricating a semiconductor structure. The method includes providing a substrate, forming stack structures arranged in parallel along a first direction over the substrate, and forming a mask layer over the substrate. The extension direction of the stack structures is parallel to a second direction. The stack structure includes a first sacrificial layer, a channel layer located on the first sacrificial layer, and a second sacrificial layer located on the channel layer. The first and second directions are parallel to the substrate surface and perpendicular to each other. A mask layer is located on the sidewall surface and the top surface of the stack structure. Initial first openings are in the mask layer. The extension direction of the initial first opening is parallel to the second direction. The initial first opening exposes part of the sidewall surface and top surface of the stack structure.

The method further includes removing the first and second sacrificial layers exposed by the initial first openings to form first openings, forming gate structures in the first openings, forming second openings in the mask layer on the two sides of the gate structures, forming source and drain doped regions in the second openings, removing the mask layer after the source and drain doped regions are formed, and forming metal layers over the substrate after the mask layer is removed. The first opening exposes the surface of the channel layer. The gate structure surrounds the channel layer. The extension direction of the second opening is parallel to the second direction, and the second opening exposes the sidewall surface of the gate structure and part of the surface of the channel layer. The source and drain doped regions contact the channel layer, respectively. The metal layers contact the source and drain doped regions. The metal layer, source and drain doped regions, and gate structure are stacked over the substrate along the second direction.

Optionally, before forming the source and drain doped regions in the second openings, the method further includes removing the first and second sacrificial layers exposed by the second opening, and after removing the first and second sacrificial layers exposed by the second opening, selectively growing an isolation layer on the sidewall surface and top surface of the gate structure. The isolation layer is located between the source or drain doped region and the gate structure.

Optionally, the material of the isolation layer includes a dielectric material that contains one or more of silicon, carbon, nitrogen, and oxygen element.

Optionally, the materials of the first and second sacrificial layers are the same. The material of the first and second sacrificial layers is different from that of the channel layer.

Optionally, the material of the channel layer includes a semiconductor material that contains silicon or germanium. The material of the first and second sacrificial layers includes silicon germanium.

Optionally, the etch rate of the first and second sacrificial layers in a process of removing the first and second sacrificial layers is greater than that of the channel layer.

Optionally, the process of removing the first and second sacrificial layers includes a wet etch process.

Optionally, the material of the mask layer includes organic materials. The organic materials include amorphous carbon, amorphous silicon, or a dielectric anti-reflective layer material.

Optionally, the fabrication method of the mask layer includes forming an initial mask layer over the substrate, forming a patterned layer on the initial mask layer, using the patterned layer as a mask to etch the initial mask layer until the substrate surface is exposed, and forming the mask layer and the initial first openings located in the mask layer.

Optionally, before forming the stack structures over the substrate, the method further includes forming an insulation layer over the substrate.

Optionally, the method of forming the stack structure includes forming a first sacrificial material layer over the insulation layer, forming a channel material layer over the first sacrificial material layer, forming a second sacrificial material layer over the channel material layer, patterning the second sacrificial material layer, channel material layer, and first sacrificial material layer to form initial stack structures arranged in parallel along the first direction, and removing part of the initial stack structure to forming discrete stack structures.

Optionally, the formation method of the metal layer includes forming a metal material layer over the substrate, planarizing the metal material layer until a surface of the source and drain doped regions and a surface of the gate structure are exposed, forming initial metal layers, and removing part of the initial metal layers to form discrete metal layers. The metal material layer contacts the source and drain doped regions.

Optionally, the method further includes removing part of the gate structure.

Optionally, the heights of the metal layers and the source and drain doped regions are flush over the substrate.

Optionally, the source and drain doped regions include sheet-like structures perpendicular to the substrate surface.

Optionally, the method further includes removing the first and second sacrificial layers to expose the channel layer after removing the mask layer and before forming the metal layer over the substrate.

Compared with the existing technology, the technical solution of the present disclosure has the following advantages:

By forming a semiconductor structure, the gate structure, source and drain doped regions, and metal layers are stacked in a direction parallel to the substrate surface. The contact area between source and drain doped regions and metal layer is increased. The contact resistance between the source and drain doped regions and the metal layer is reduced. The aperture length perpendicular to the substrate is decreased. It improves performance of the semiconductor structure.

FIG. 1 shows a cross-sectional view of a semiconductor structure. As shown in FIG. 1, the semiconductor structure includes a substrate 100, a gate structure 101 located on the substrate 100, spacers (not labeled) located on the sidewalls of the gate structure 101, source and drain doped regions 102 located in the substrate 100 on both sides of the gate structure 101, plugs 103 located in the source and drain doped regions 102 and electrically connected to the source and drain doped regions 102, and metal layers 104 located on the plugs 103.

The semiconductor structure in FIG. 1 is a two-dimensional (2D) material field effect transistor (FET). The performance of the 2D material FET is affected by the contact resistance of the material-material interface. Interactions between a metal and the 2D system lead to metal-induced gap states (MIGS) in the band gap of the 2D materials. It results in the Fermi level pinning at and contacting the Schottky barrier in the contact interface. Subsequently, when the contact area is under gate control, it causes associated field contact resistance (Rc).

In the semiconductor structure, the metal layer 104, plug 103, and source or drain doped region 102 are vertically stacked on the substrate 100. The source and drain doped region 102 and plugs 103 are in direct contact. When the size of the plug 103 becomes smaller and smaller, the contact area between the source or drain doped region 102 and the plug 103 becomes smaller, which results in a relatively large contact resistance.

In order to solve the above-mentioned problems, the present disclosure provides a semiconductor structure and a method for forming the semiconductor structure. By forming a semiconductor structure, the gate structure, source and drain doped regions, and metal layers are stacked in a direction parallel to the substrate surface. The contact area between the source or drain doped region and the metal layer is increased. The contact resistance between the source or drain doped region and the metal layer is decreased. The aperture length perpendicular to substrate is reduced. The performance of the semiconductor structure may be improved.

Figure 2:
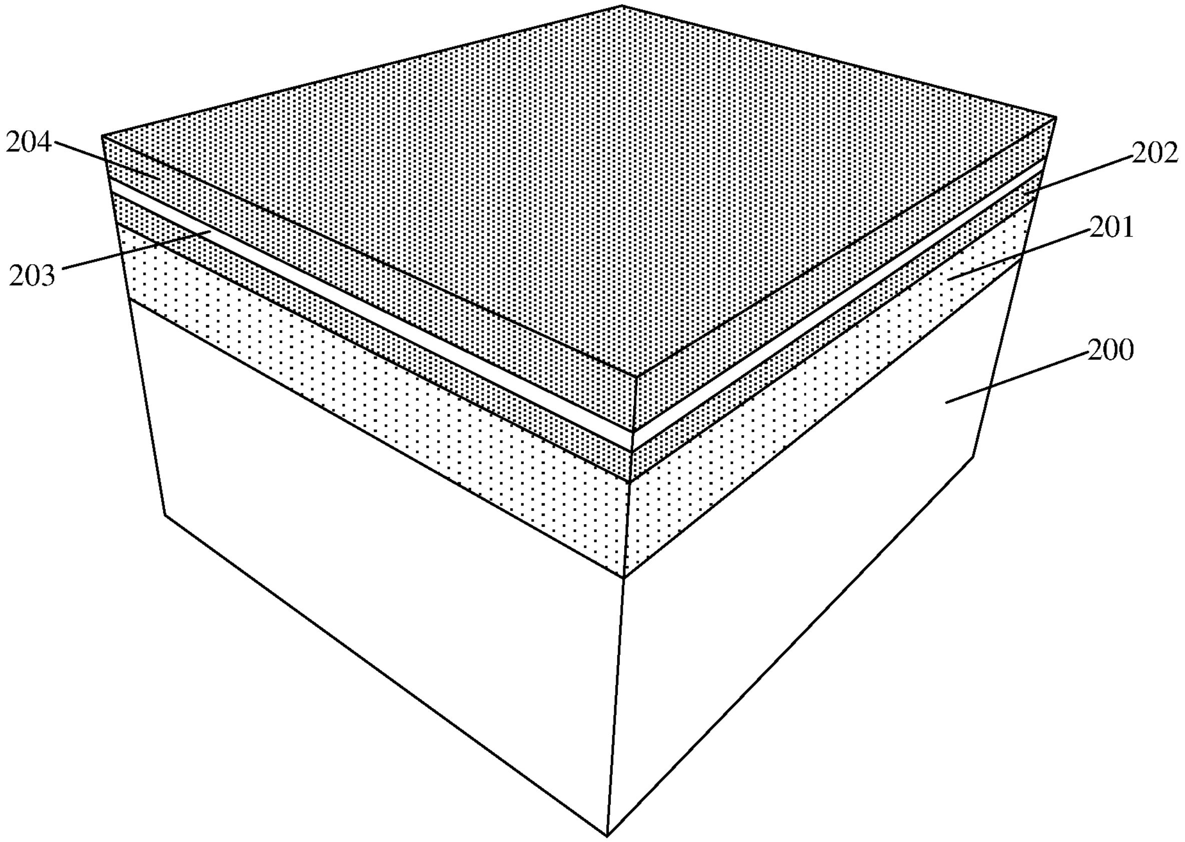
FIGS. 2-9 illustrate perspective views corresponding to certain fabrication stages for forming a semiconductor structure according to various disclosed embodiments of the present disclosure.

FIGS. 2-9 show perspective views corresponding to certain fabrication stages for forming a semiconductor structure according to embodiments of the present disclosure. Referring to FIG. 2, a substrate 200 is provided. An insulation layer 201 is formed over the substrate 200. The substrate 200 may include silicon, silicon carbide, silicon germanium, multi-element semiconductor material composed of III-V group elements, silicon on insulator (SOI), or germanium on insulator (GOI).

The material of the insulation layer 201 may include dielectric materials, and the dielectric materials may include silicon oxide, silicon nitride, silicon carbide, silicon oxycarbide, silicon oxynitride, aluminum oxide, aluminum nitride, silicon nitride carbide, oxynitride, or any combination thereof. In descriptions below, the material of the insulation layer 201 includes silicon oxide exemplarily.

Further, stack structures are formed in parallel along a first direction over the substrate 200. The extension direction of the stack structure is parallel to a second direction. The stack structure includes a first sacrificial layer, a channel layer located on the first sacrificial layer, and a second sacrificial layer located on the channel layer. The first and second directions are parallel to the substrate surface and perpendicular to each other. A formation process of the stack structures is illustrated in FIGS. 2 and 3 schematically.

Referring to FIG. 2, a first sacrificial material layer 202 is formed on the insulation layer 201, a channel material layer 203 is formed on the first sacrificial material layer 202, and a second sacrificial material layer 204 is formed on the channel material layer 203.

In some embodiments, the first sacrificial material layer 202, channel material layer 203, and second sacrificial material layer 204 as a whole may be bonded together with the substrate through the insulation layer.

Figure 3:
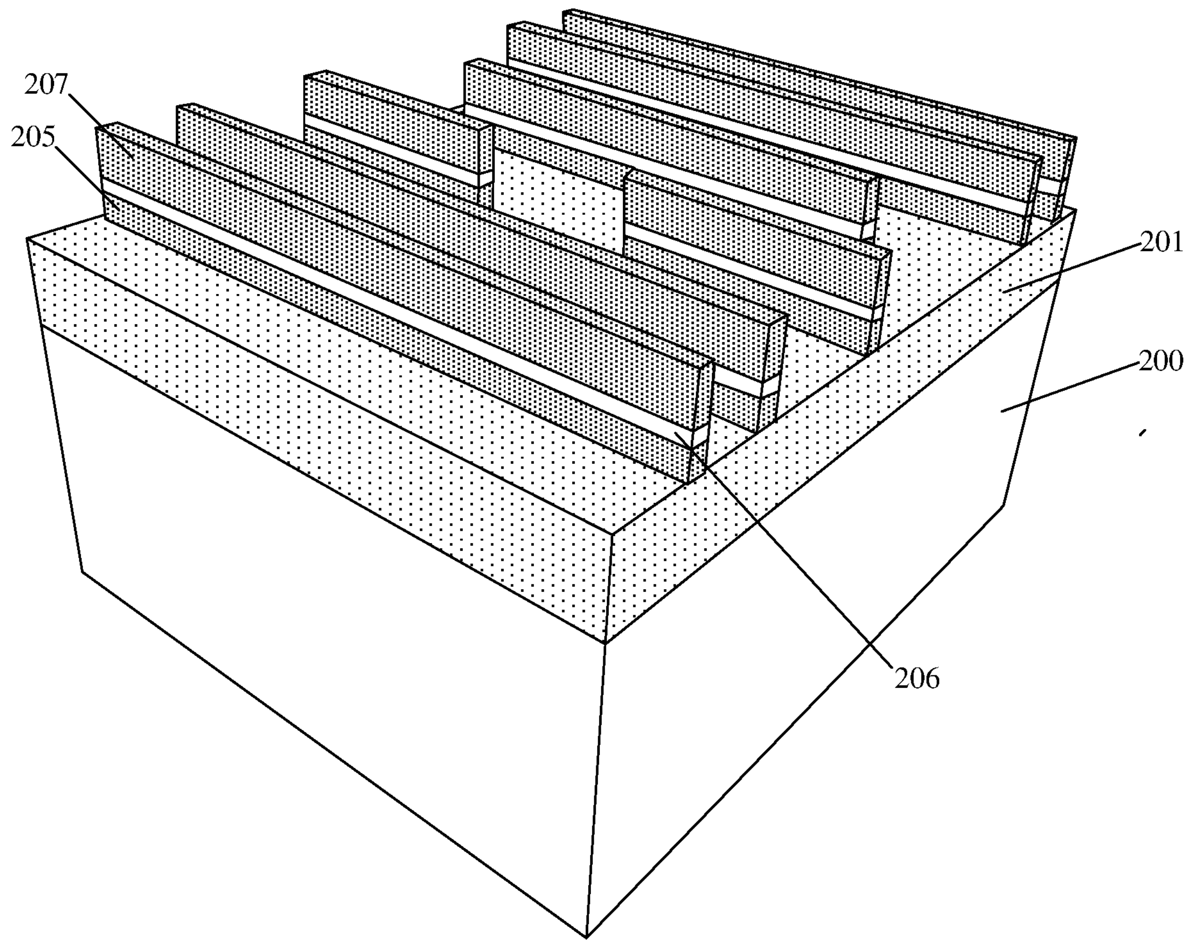

Referring to FIG. 3, the second sacrificial material layer 204, channel material layer 203, and first sacrificial material layer 202 are patterned to form multiple initial stack structures arranged in parallel along the first direction. Part of the initial stack structures is removed to form discrete stack structures. The stack structure includes a first sacrificial layer 205, a channel layer 206 located on the first sacrificial layer 205, and a second sacrificial layer 207 located on the channel layer 206.

The first and second sacrificial layers 205 and 207 are made of the same material. The material of the first and second sacrificial layers 205 and 207 is different from that of the channel layer 206. In some embodiments, the etching selectivity ratio is large between the material of the first and second sacrificial layers 205 and 207 and that of the channel layer 206.

In some further embodiments, the material of the channel layer 206 includes a semiconductor material that may contain silicon or germanium. The material of the first and second sacrificial layers 205 and 207 may include silicon germanium.

Figure 4:
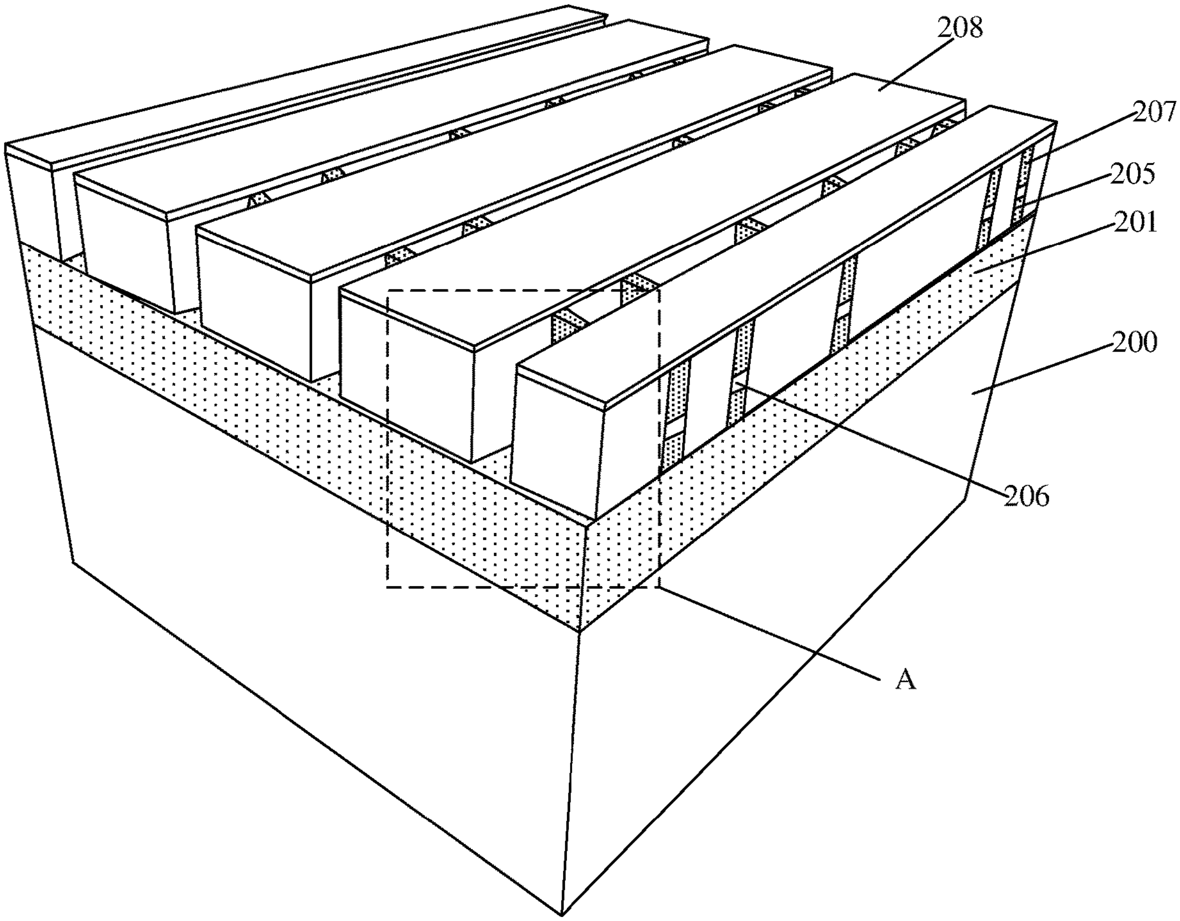
Figure 5:
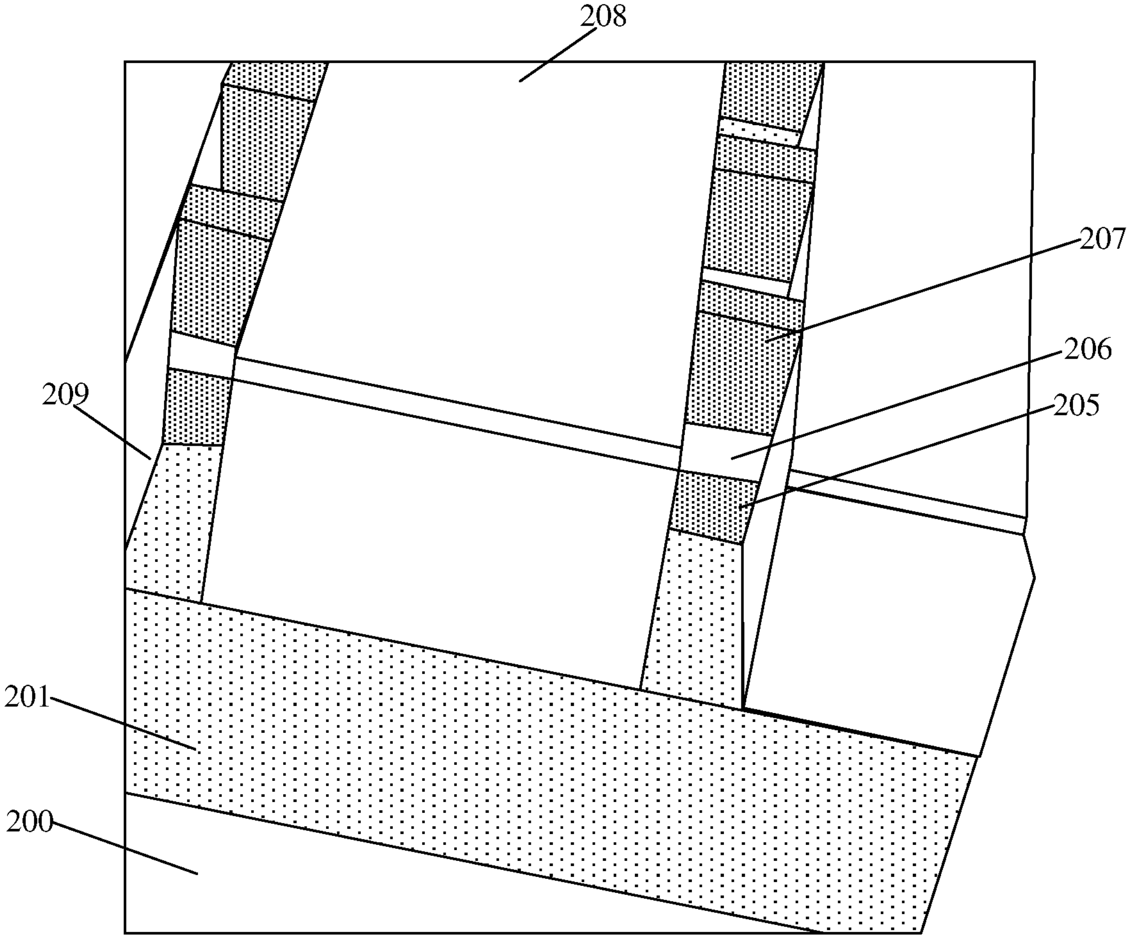

FIG. 5 shows an enlarged schematic diagram of an area A in FIG. 4. Referring to FIGS. 4 and 5, a mask layer 208 is formed over the substrate 200. The mask layer 208 is located on the sidewall surface and the top surface of the stack structure. Initial first openings 209 are formed in the mask layer 208. The extension direction of the initial first opening 209 is parallel to the first direction. The initial first opening 209 exposes part of the sidewall surface and top surface of the stack structure.

In some embodiments, the material of the mask layer 208 may include organic materials. Optionally, the organic material may contain amorphous carbon, amorphous silicon, or a dielectric anti-reflective layer material.

A formation method of the mask layer 208 includes forming an initial mask layer (not shown) over the substrate 200, forming a patterned layer (not shown) over the initial mask layer, using the patterned layer as a mask to etch the initial mask layer until the surface of the insulation layer 201 is exposed, and forming the mask layer 208 and initial first openings 209 in the mask layer 208.

Figure 6:
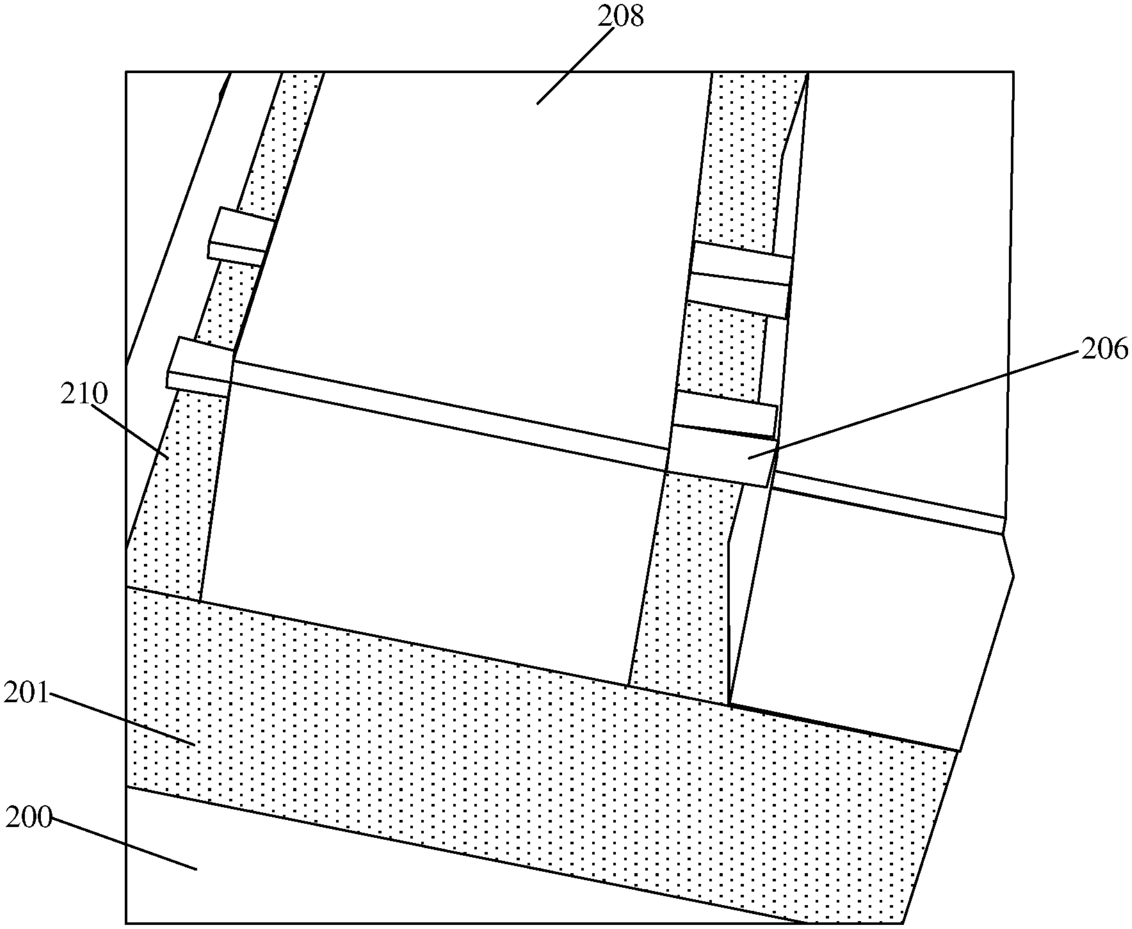

FIG. 6 is a schematic diagram based on FIG. 5. Referring to FIG. 6, the first and second sacrificial layers 205 and 207 exposed by the initial first openings 209 are removed by etch. First openings 210 are formed. The first opening 210 exposes the surface of the channel layer 206.

The etch rate of the first and second sacrificial layers 205 and 207 in the process of removing the first and second sacrificial layers 205 and 207 is greater than the etch rate of the channel layer 206.

In some embodiments, the process of removing the first and second sacrificial layers 205 and 207 includes a wet etch process.

In some further embodiments, a gate dielectric layer (not shown) may be formed on the exposed surface of the channel layer 206 and surround the channel layer 206 in a plane perpendicular to the second direction. Optionally, the gate dielectric layer contains a dielectric material, e.g., silicon oxide and may be fabricated by a deposition process or oxidation process.

Figure 7:
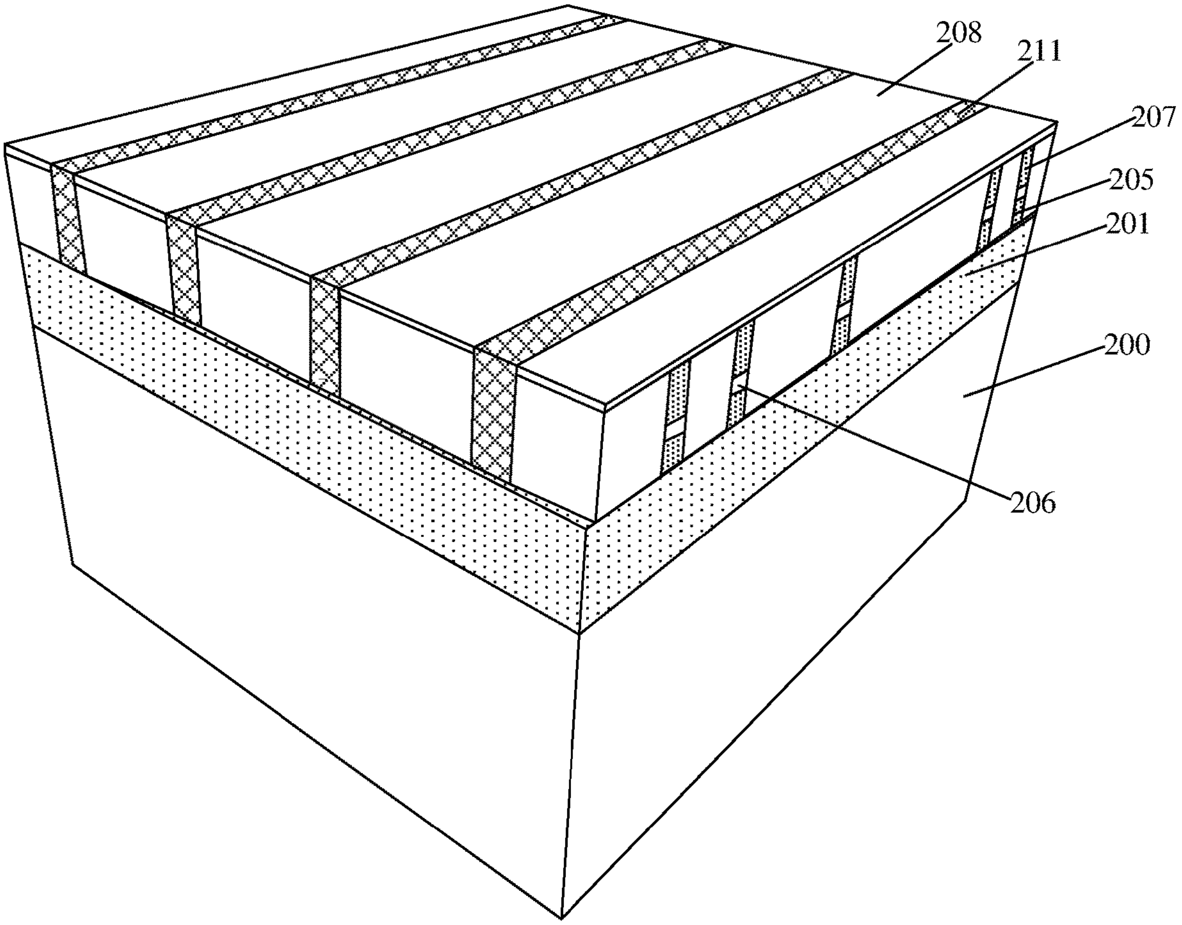

Referring to FIG. 7, a gate structure 211 is formed in the first opening 210. The gate structure 211 surrounds the channel layer 206 and the gate dielectric layer. The gate dielectric layer is between the gate structure 211 and channel layer 206.

The material of the gate structure 211 may include polysilicon or metal. The metal includes, e.g., tungsten.

A method of forming the gate structure 211 includes forming a gate structure material layer in the first opening 211 and on the mask layer 208, planarizing the gate structure material layer until the surface of the mask layer 208 is exposed, and forming the gate structure 211.

Figure 8:
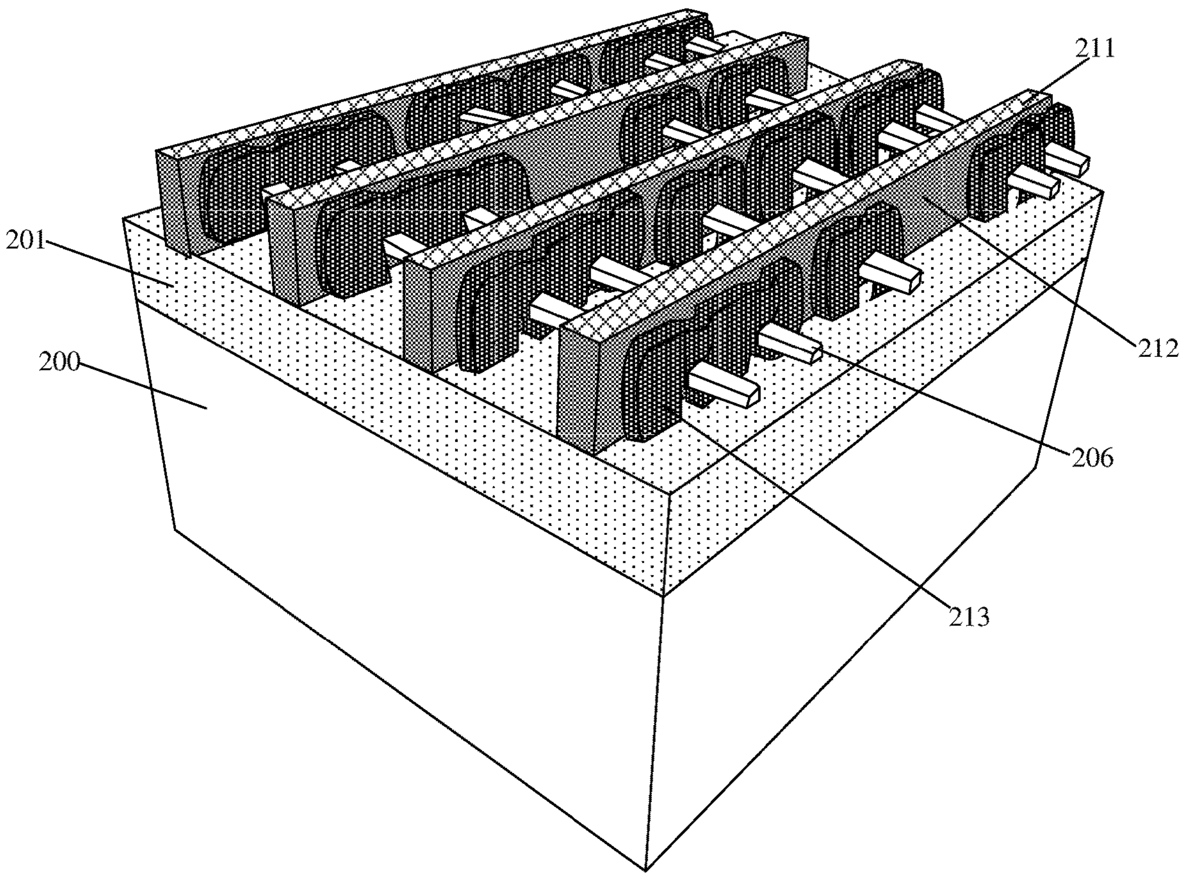

Referring to FIG. 8, second openings (not shown) are formed in the mask layer 208 on both sides of the gate structures 211. The extension direction of the second opening is parallel to the first direction. The second opening exposes the sidewall surface of the gate structure 211 and part of the surface of the channel layer 206.

A method of forming the second opening includes forming a patterned layer (not shown) on the mask layer 208, using the patterned layer as a mask to etch the mask layer 208 until surfaces of the insulation layer 201 and gate structure 211 are exposed, and forming the second opening in the mask layer 208.

Referring to FIG. 8, the first and second sacrificial layers 205 and 207 exposed by the second opening are removed. After removing the first and second sacrificial layers 205 and 207 exposed by the second opening, isolation layers 212 are selectively grown on the sidewall surfaces and the top surfaces of the gate structures 211.

The isolation layer 212 is used to electrically isolate the gate structure 211 and the source or drain doped region.

The material of the isolation layer 212 may include a dielectric material that contains one or more of silicon, carbon, nitrogen, and oxygen element.

The selective growth process causes the isolation layer 212 to be formed only on the surface of the gate structure 211. It should be noted that the isolation layer 212 located on the top surface of the gate structure 211 is omitted in FIG. 8.

Referring to FIG. 8, the source and drain doped regions 213 are formed in the second opening. The source and drain doped regions 213 contact the channel layer 206, respectively. The isolation layer 212 is located between the source or drain doped region 213 and the gate structure 211.

In some embodiments, the source and drain doped regions 213 have sheet-like structures that are perpendicular to the surface of the substrate 200. The source and drain doped regions 213 are formed in the second opening. The width of the second opening is relatively small. The formation of the source and drain doped regions 213 is limited by the gate structure 211 and mask layer 208. The shape thus formed is a sheet-like structure perpendicular to the surface of the substrate 200.

Optionally, when the transistor is PMOS, the material of the source and drain doped regions 213 includes silicon germanium. When the transistor is NMOS, the material of the source and drain doped regions 213 includes phosphorus silicon.

Referring to FIG. 8, after the source and drain doped regions 213 are formed, the mask layer 208 is removed. In some cases, the mask layer 208 is made of organic materials and is easy to remove. The process of removing the mask layer 208 includes a dry etch process or a wet etch process.

Figure 9:
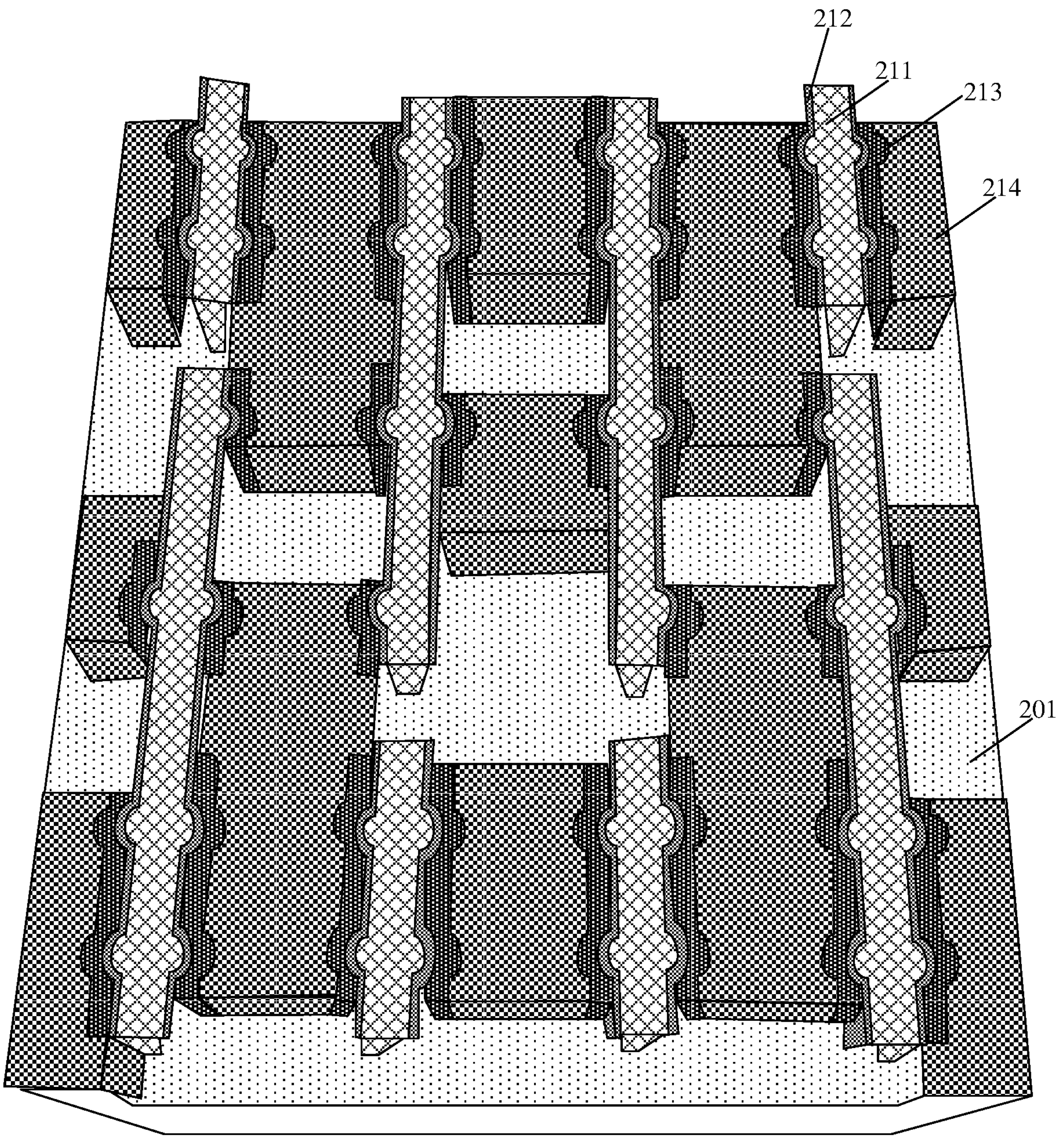

FIG. 9 shows a perspective view along a downward direction. Referring to FIG. 9, metal layers 214 are formed over the substrate 200. The metal layers 214 contact the source and drain doped regions 213, respectively. The metal layer 214, source and drain doped regions 213, and gate structure 211 are stacked along the second direction over the substrate 200.

A formation method of the metal layer 214 includes forming a metal material layer (not shown) over the substrate 200 and contacting the source and drain doped regions 213, planarizing the metal material layer until surfaces of the source and drain doped regions 213 and the gate structures 211 are exposed, forming initial metal layers (not shown), removing part of the initial metal layers, and forming discrete metal layers 214.

In some cases, heights of the metal layers 214 and source and drain doped regions 213 are flush over the substrate 200.

The gate structure 211, source and drain doped regions 213, and metal layer 214 are stacked in a direction parallel to the surface of the substrate 200. Thus, the contact area between the source or drain doped region 213 and metal layer 214 is increased. The contact resistance between the source or drain doped region 213 and metal layer 214 is reduced, the aperture length in a direction perpendicular to the substrate 200 is decreased, and the performance of the semiconductor structure is improved.

The present disclosure provides a semiconductor structure. Referring to FIG. 9, the semiconductor structure includes: the substrate 200; the channel layers 206 arranged in parallel along the first direction and gate structures 211 arranged in parallel along the second direction over the substrate 200, wherein the gate structure 211 surrounds the channel layer 206, and the first and second directions are parallel to the surface of the substrate 200 and perpendicular to each other; the source and drain doped regions 213 located on both sides of the gate structure 211, wherein the source and drain doped regions 213 are in contact with the channel layer 206; and the metal layer 214 over the substrate 200. The metal layer 214 contacts the source and drain doped regions 213. The metal layer 214, source or drain doped region 213, and gate structure 211 are stacked over the substrate 200 along the second direction.

In some embodiments, the semiconductor structure further includes the isolation layer 212 located on the sidewall surface and the top surface of the gate structure 211. The isolation layer 212 is located between the source or drain doped region 213 and gate structure 211.

In some embodiments, the material of the isolation layer 212 includes a dielectric material, and the dielectric material includes a material containing one or more of silicon, carbon, nitrogen, and oxygen element.

In some embodiments, the material of the channel layer 206 includes a semiconductor material, and the semiconductor material includes silicon or germanium.

In some embodiments, the semiconductor structure further includes the insulation layer 201 located over the substrate 200. The gate structure 211 is located over the insulation layer 201.

In some embodiments, heights of the metal layer 214 and source and drain doped regions 213 are flush over the substrate 200.

Figure 10:
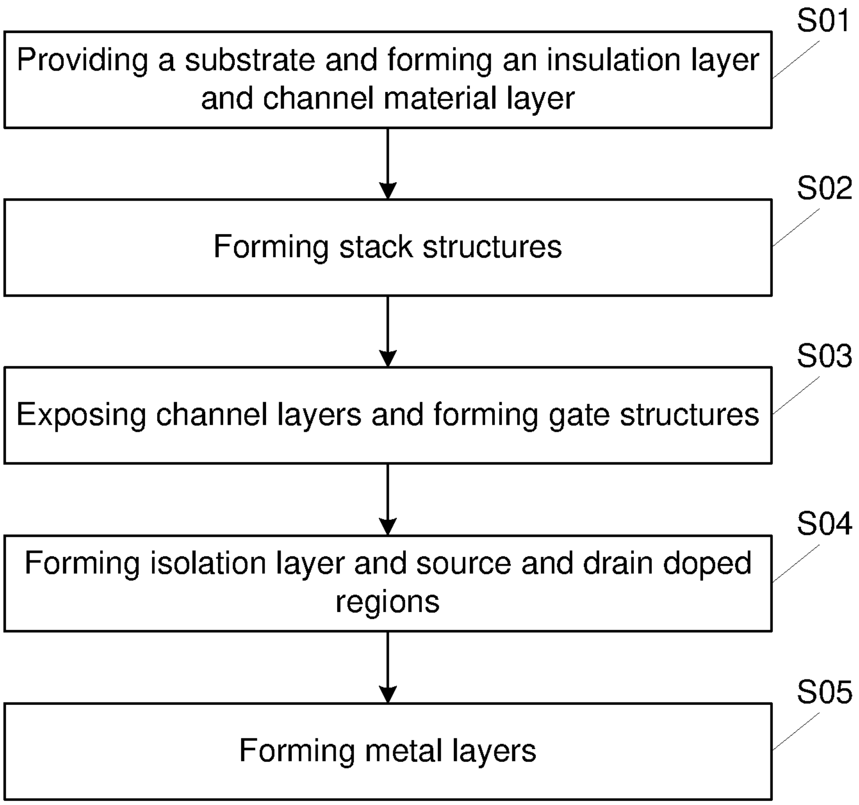
FIG. 10 illustrates an exemplary method for forming a semiconductor structure according to various disclosed embodiments of the present disclosure.

FIG. 10 shows a schematic flow chart to illustrate methods for making a semiconductor structure according to the present disclosure. At S01, a substrate (e.g., the substrate 200 in FIG. 2) is provided for fabricating the semiconductor structure. The substrate may include a semiconductor material (e.g., single crystalline silicon) or an electrically nonconductive material. An insulation layer, a first sacrificial material layer, a channel material layer, and a second sacrificial material layer (e.g., the layers 201, 202, 203, and 204 in FIG. 2) are formed over the substrate sequentially. The channel material layer is between the first and second sacrificial material layers. The insulation layer contains one or more dielectric materials.

At S02, the second sacrificial material layer, channel material layer, and first sacrificial material layer are patterned and etched to form discrete stack structures. The stack structures are arranged in parallel along a first direction (e.g., the X direction) and extend along a second direction (e.g., the Y direction). The stack structure includes a first sacrificial layer, a channel layer on the first sacrificial layer, and a second sacrificial layer on the channel layer (e.g., the layers 205, 206, and 207 in FIG. 3). Optionally, the first and second sacrificial layers contain the same material that is different from the material of the channel layer. In some cases, the etch rate of the material of the first and second sacrificial layers is faster than that of the channel layer. In some embodiments, the channel layer may include a semiconductor material such as contain silicon or germanium, and the first and second sacrificial layers may include silicon germanium.

At S03, a mask layer (e.g., the mask layer 208 in FIG. 4) is deposited that filled gaps between the stack structures. The mask layer is patterned and then etched to create initial first openings (e.g., the openings 209 in FIG. 5). The initial first openings extend along the X direction and expose sidewalls of the stack structures and the insulating layer. Exposed parts of the first and second sacrificial layers are etched away selectively, leaving the channel layers in the air with four surfaces exposed. The initial first openings become first openings (e.g., openings 210 in FIG. 6). Optionally, a gate dielectric layer is grown on the exposed surfaces of the channel layer and surrounds the channel layer. The gate dielectric layer contains a dielectric material such as silicon oxide. Further, the first openings are filled by a conductive material (e.g., polysilicon or metal) to form gate structures (e.g., the gate structure 211 in FIG. 7). The gate structure is deposited on the gate electric layer to surround the channel layer.

At S04, second openings are etched in the remaining mask layer, exposing sidewalls of the gate structures, the first and second sacrificial layers, and the channel layers outside the gate structures. The second openings extend in the X direction. The exposed first and second sacrificial layers are etched selectively, leaving the channel layers exposed outside the gate structures. Further, isolation layers (e.g., the layer 212 in FIG. 8) are selectively grown on the sidewall surfaces and top surfaces of the gate structures. The isolation layer 212 includes a dielectric material. Further, source and drain doped regions (e.g., the regions 213 in FIG. 8) are formed over the sidewalls of the gate structures and on the isolation layers in the second openings. The source and drain doped regions are also formed on and contact the channel layer. The source and drain doped regions have sheet-like structures that are perpendicular to the surface of the substrate.

At S05, remaining mask layer portions are etched away. Metal layers (e.g., the metal layer 214 in FIG. 9) are formed in the second openings over the substrate. The metal layers contact the source and drain doped regions, respectively. The metal layer, source and drain doped regions, and gate structure are stacked along the Y direction. That is, the metal layer, source and drain doped regions, and gate structure are arranged parallel in the Y direction, while the substrate is in the X-Y plane.

In consistent with the above descriptions, an exemplary semiconductor structure includes a channel layer and five parallel layers. The channel layer extends in the Y direction. The five parallel layers include a first metal layer, a source layer as the source doped region, a gate layer as the gate structure, a drain layer as the drain doped region, and a second metal layer. The first metal layer is formed on and electrically connects with the source layer. The second metal layer is formed on and electrically connects with the drain layer. The gate layer surrounds the channel layer in a plane perpendicular to the Y direction. A first isolation layer is between the source layer and the gate layer. A second isolation layer is between the drain layer and the gate layer. A gate dielectric layer is between the gate layer and channel layer. The source layer and drain layer are formed on and electrically connect with the channel layer, respectively. The five parallel layers are perpendicular to the Y direction and the substrate, extend in planes perpendicular to the Y direction, and stacked together in the Y direction. The channel layer passes through the five parallel layers along the Y direction, respectively. Optionally, the channel layer at least passes through the source layer, gate layer, and drain layer, respectively.

Further, certain structures and layers described above in the present disclosure may be formed by deposition techniques such as chemical vapor deposition (CVD), physical vapor deposition (PVD), or atomic layer deposition (ALD).

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor structure, comprising:

a substrate;

a plurality of channel layers arranged in parallel along a first direction and extending along a second direction over the substrate and a plurality of gate structures arranged in parallel along the second direction over the substrate, the plurality of gate structures surrounding the plurality of channel layers, respectively, the first direction and the second direction being parallel to a substrate surface and perpendicular to each other;

a source doped region and a drain doped region located on two sides of one of the plurality of gate structures and disposed along the second direction parallel to the substrate surface, one of the plurality of channel layers passing through the source and drain doped regions along the second direction, and the source and drain doped regions contacting the one of the plurality of channel layers; and a metal layer over the substrate, the metal layer contacting the source doped region or the drain doped region, and the metal layer, the source and drain doped regions, and the one of the plurality of gate structures being stacked along the second direction over the substrate.

2. The semiconductor structure according to claim 1, further comprising:

an isolation layer on a sidewall surface and a top surface of the one of the plurality of gate structures, the isolation layer being between the source or drain doped region and the one of the plurality of gate structures.

3. The semiconductor structure according to claim 2, wherein a material of the isolation layer includes a dielectric material that includes one or more of silicon, carbon, nitrogen, and oxygen element.

4. The semiconductor structure according to claim 1, wherein a material of the plurality of channel layers includes a semiconductor material, and the semiconductor material includes silicon or germanium.

5. The semiconductor structure according to claim 1, further comprising:

an insulation layer over the substrate, the plurality of gate structures being over the insulation layer.

6. The semiconductor structure according to claim 1, wherein a height of the metal layer and a height of the source and drain doped regions are flush over the substrate.

7. The semiconductor structure according to claim 1, wherein the source and drain doped regions are sheet-like structures perpendicular to the substrate surface.

8. A method for forming a semiconductor structure, comprising:

providing a substrate;

forming a plurality of stack structures arranged in parallel along a first direction over the substrate, wherein an extension direction of each stack structure is parallel to a second direction, each stack structure includes a first sacrificial layer, a channel layer extending along the second direction on the first sacrificial layer, and a second sacrificial layer on the channel layer, and the first and second directions are parallel to a substrate surface and perpendicular to each other;

forming a mask layer over the substrate, wherein the mask layer is on a sidewall surface and a top surface of the plurality of the stack structures, an initial first opening is in the mask layer, an extension direction of the initial first opening is parallel to the first direction, and the initial first opening exposes a part of the sidewall surface and the top surface;

removing the first and second sacrificial layers exposed by the initial first opening to form a first opening, the first opening exposing a surface of the channel layer;

forming a gate structure in the first opening, the gate structure surrounding the channel layer;

forming two second openings on two sides of the gate structure along the second direction parallel to the substrate surface and in the mask layer, wherein an extension direction of the second openings is parallel to the first direction, and the second opening exposes a sidewall surface of the gate structure and a part of a surface of the channel layer;

forming a source doped region and a drain doped region in the second openings, the source and drain doped regions contacting the channel layer;

removing the mask layer after the source and drain doped regions are formed; and forming a metal layer over the substrate after the mask layer is removed, wherein the metal layer contacts the source doped region or the drain doped region, and the metal layer, the source and drain doped regions, and the gate structure are stacked along the second direction over the substrate.

9. The method according to claim 8, further comprising:

before forming the source and drain doped regions in the second openings, removing the first and second sacrificial layers exposed by the second openings; and after removing the first and second sacrificial layers exposed by the second openings, selectively growing an isolation layer on the sidewall surface and top surface of the gate structure, the isolation layer being between the source or drain doped region and the gate structure.

10. The method according to claim 8, wherein a material of the channel layer includes a semiconductor material that includes silicon or germanium and a material of the first and second sacrificial layers includes silicon germanium.

11. The method according to claim 8, wherein an etch rate of the first and second sacrificial layers in a process of removing the first and second sacrificial layers is greater than an etch rate of the channel layer.

12. The method according to claim 8, wherein a material of the mask layer includes an organic material, and the organic material includes amorphous carbon, amorphous silicon, or a dielectric anti-reflective layer material.

13. The method according to claim 8, wherein a fabrication method of the mask layer includes:

forming an initial mask layer over the substrate;

forming a patterned layer over the initial mask layer;

using the patterned layer as a mask to etch the initial mask layer until the substrate surface is exposed; and forming the mask layer and the initial first opening in the mask layer.

14. The method according to claim 8, further comprising:

before forming the plurality of stack structures over the substrate, forming an insulation layer over the substrate.

15. The method according to claim 14, wherein a method of forming the plurality of stack structures includes:

forming a first sacrificial material layer over the insulation layer;

forming a channel material layer over the first sacrificial material layer;

forming a second sacrificial material layer over the channel material layer;

patterning the second sacrificial material layer, the channel material layer, and the first sacrificial material layer to form a plurality of initial stack structures arranged in parallel along the second direction; and removing a part of the plurality of initial stack structures to form plurality of stack structures.

16. The method according to claim 8, wherein a method of forming the metal layer includes:

forming a metal material layer over the substrate, the metal material layer contacting the source or drain doped region;

planarizing the metal material layer until a surface of the source and drain doped regions and a surface of the plurality of stack structures are exposed;

forming an initial metal layer; and removing a part of the initial metal layer to form the metal layer.

17. The method according to claim 8, wherein a height of the metal layer and a height of the source and drain doped regions are flush over the substrate.

18. The method according to claim 8, wherein the source and drain doped regions include a sheet-like structure perpendicular to the substrate surface.

19. The method according to claim 8, further comprising:

removing the first and second sacrificial layers to expose the channel layer after removing the mask layer and before forming the metal layer over the substrate.

20. A semiconductor structure, comprising:

a substrate;

a channel layer extending along a first direction parallel to a substrate surface;

a first metal layer extending in a first plane perpendicular to the first direction and the substrate surface;

a source layer as a source doped region, the source layer extending in a second plane parallel to the first plane;

a gate layer as a gate structure, the gate layer extending in a third plane parallel to the first plane;

a drain layer as a drain doped region, the drain layer extending in a fourth plane parallel to the first plane; and a second metal layer extending in a fifth plane parallel to the first plane, wherein the first metal layer, the source layer, the gate layer, the drain layer, and the second metal layer are stacked along the first direction, the channel layer passes through the source layer, the gate layer, and the drain layer along the first direction, the gate layer surrounds the channel layer in the third plane, and the source layer and the drain layer contact the channel layer in the second plane and the fourth plane, respectively.

* * * * *